US012660587B2

(12) United States Patent
Chen et al.

(10) Patent No.: US 12,660,587 B2
(45) Date of Patent: Jun. 16, 2026

(54) SEMICONDUCTOR DEVICE

(71) Applicant: Taiwan Semiconductor Manufacturing Company, Ltd., Hsinchu (TW)

(72) Inventors: Yi-Ren Chen, Hsinchu (TW); Po-Cheng Chi, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 384 days.

(21) Appl. No.: 18/224,489

(22) Filed: Jul. 20, 2023

(65) Prior Publication Data

US 2025/0029893 A1     Jan. 23, 2025

(51) Int. Cl.
| | |
|---|---|
| *H01L 23/48* | (2006.01) |
| *H10W 20/20* | (2026.01) |
| *H10D 30/43* | (2025.01) |
| *H10D 30/67* | (2025.01) |
| *H10D 62/10* | (2025.01) |

(52) U.S. Cl.
CPC ............ *H10W 20/20* (2026.01); *H10D 30/43* (2025.01); *H10D 30/6735* (2025.01); *H10D 30/6757* (2025.01); *H10D 62/121* (2025.01)

(58) Field of Classification Search
CPC ............... H01L 23/481; H01L 23/5226; H01L 23/5283; H01L 23/485; H10D 30/43; H10D 30/6735; H10D 30/6757; H10D 62/121; H10D 30/501
USPC ........................................................ 257/734
See application file for complete search history.

(56) References Cited

U.S. PATENT DOCUMENTS

| | | | |
|---|---|---|---|
| 2020/0135869 A1* | 4/2020 | Ciou | ..................... H10D 62/127 |
| 2022/0415782 A1* | 12/2022 | Choi | ...................... H10D 30/43 |

* cited by examiner

*Primary Examiner* — Tong-Ho Kim
(74) *Attorney, Agent, or Firm* — Birch, Stewart, Kolasch & Birch, LLP

(57) ABSTRACT

A semiconductor device includes a substrate, a plurality of oxide definition structures, a plurality of metal gates and a first conductive via. The oxide definition structures are formed on the substrate and arranged in a first direction. The metal gates are formed on the substrate and extend in a second direction. The first conductive via is formed on the substrate, located between two of the metal gates, extends in the first direction and has a first width in the second direction. There is a pitch between adjacent two of the metal gates in the second direction, and a first ratio of the first width to the pitch ranges between 0.2 and 0.7.

20 Claims, 8 Drawing Sheets

SEMICONDUCTOR DEVICE

BACKGROUND

With the shrinking of a semiconductor device, a size of a dielectric layer filling an interval between adjacent two conductive components is accordingly reduced. However, such structure will cause the increasing of the parasitic capacitance of the dielectric layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
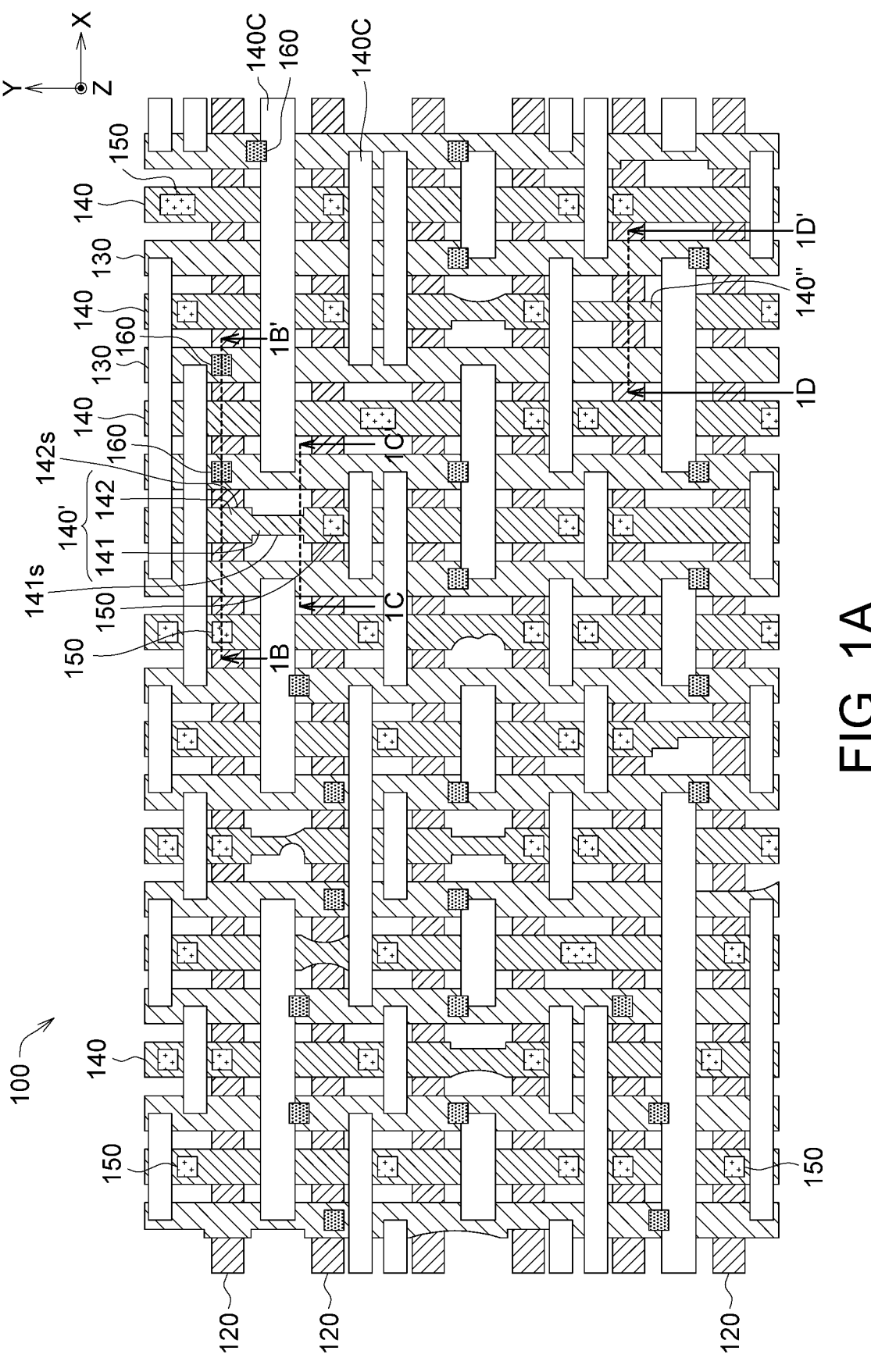
FIG. 1A illustrates a schematic diagram of a top view of a semiconductor device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
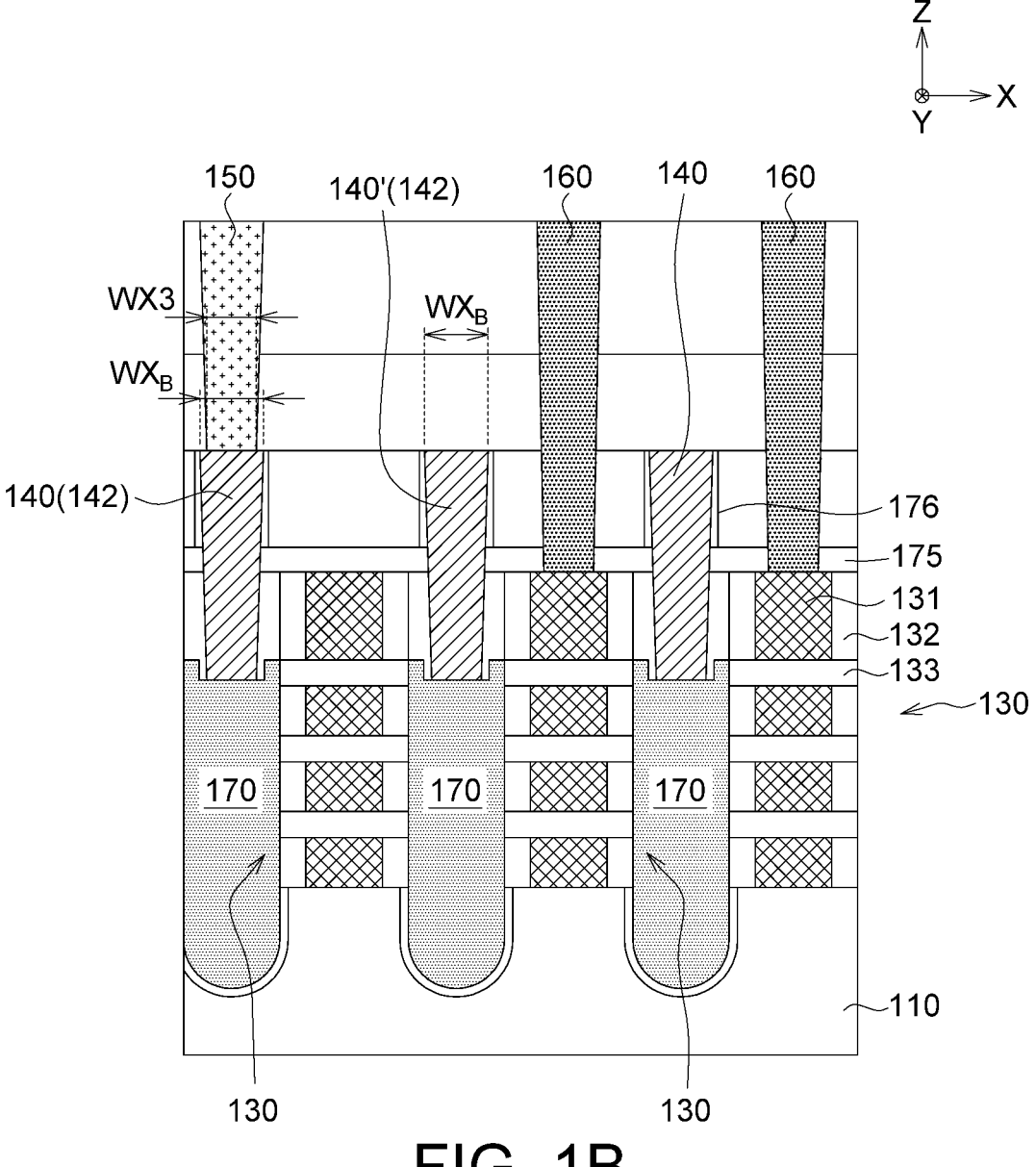
FIG. 1B illustrates a schematic diagram of a cross-sectional view of the semiconductor device in a direction 2-2'.
Figure 1C:
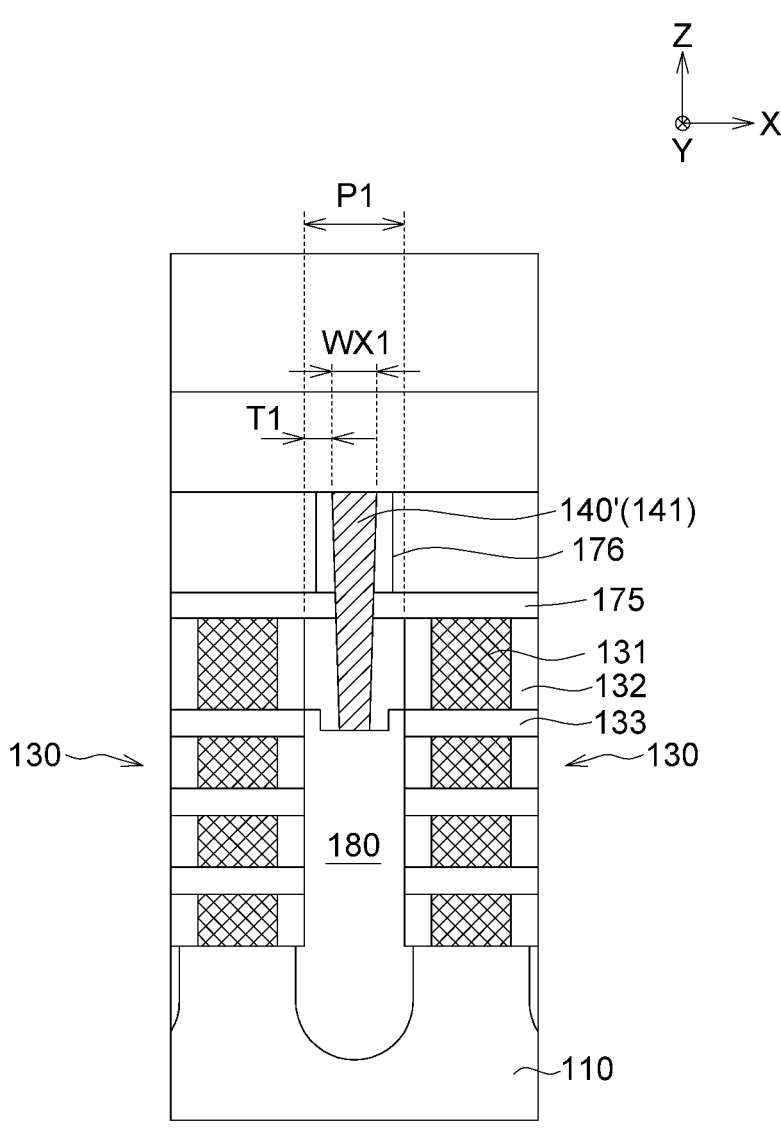
FIG. 1C illustrates a schematic diagram of a cross-sectional view of the semiconductor device in a direction 3-3'.
Figure 1D:
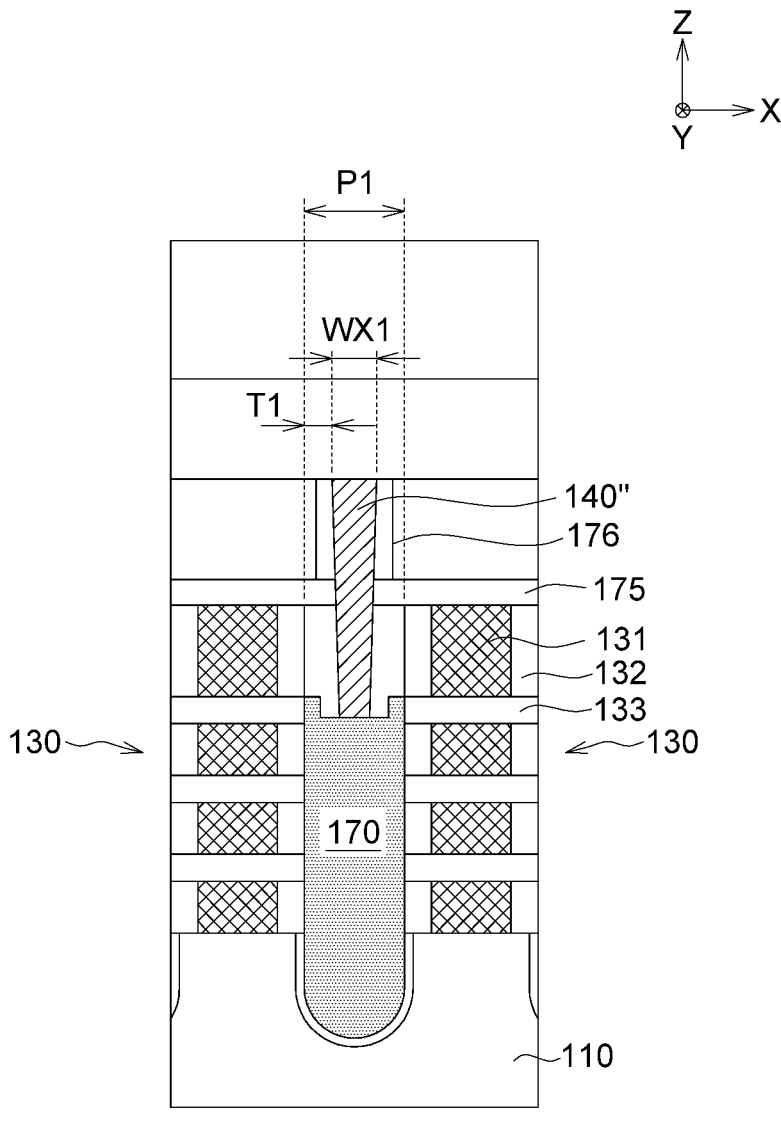
FIG. 1D illustrates a schematic diagram of a cross-sectional view of the semiconductor device in a direction 4-4'.

Referring to FIGS. 1A to 1D, FIG. 1A illustrates a schematic diagram of a top view of a semiconductor device 100, FIG. 1B illustrates a schematic diagram of a cross-sectional view of the semiconductor device 100 in a direction 2-2', FIG. 1C illustrates a schematic diagram of a cross-sectional view of the semiconductor device 100 in a direction 3-3', and FIG. 1D illustrates a schematic diagram of a cross-sectional view of the semiconductor device 100 in a direction 4-4'. The semiconductor device 100 may be, for example, a forksheet structure, a nanosheet structure, etc.

As illustrated in FIGS. 1A to 1C, the semiconductor device 100 includes a substrate 110, a plurality of oxide definition (OD) structures 120, a plurality of metal gates 130, at least one first conductive via 140, at least one second conductive via 150, at least one third conductive via 160, at least one epitaxy layer 170, at least one spacer 175, at least one spacer 176 and at least on oxide layer 180.

As illustrated in FIGS. 1A to 1C, the OD structures 120 are formed on the substrate 110 and arranged in a first direction Y. The metal gates 130 are formed on the substrate 110 and extend in the first direction Y. The first conductive via 140 is formed on the substrate 110, located between two of the metal gates 130, extends in the first direction Y and has a first width WX1 in a second direction X. There is a pitch P1 (not shown) between adjacent two of the metal gates 130 in the second direction X, and a first ratio R11 of the first width WX1 to the pitch P1 (that is, R11=WX1/P1) ranges between 15 nanometer (nm) and 50 nm. As a result, the first width WX1 widens at least one interval T1 between the adjacent metal gate 130 and first conductive via 140, and accordingly it may reduce the parasitic capacitance of the dielectric material (for example, the spacer 175 and/or the spacer 176, etc.) between the metal gate 130 and the first conductive via 140 for increasing reaction speed of the device.

In an embodiment, depending on the size of the semiconductor device 100, the pitch P1 may range between 15 nm and 50 nm. In addition, the greater the interval T1 is, the less the parasitic capacitance of the semiconductor device 100 is.

The substrate 110 is formed of a material including, for example, silicon. Furthermore, the substrate 110 is, for example, a silicon wafer.

As illustrated in FIGS. 1B and 1C, each metal gate 130 includes at least one metal layer 131, at least one inner spacer 132 and at least one sheet 133. The inner spacer 132 is formed on a sidewall of the metal 131. The sheet 133 is formed between adjacent two metal layers 131. In addition, the metal 131 may be formed of a material including, for example, W, TiN, Al, TiAl, TiAlC, TaN, etc., and the sheet 133 may be formed of a material including, for example, silicon.

As illustrated in FIGS. 1A and 1C, the first conductive via 140 is connected to the epitaxy layer 170. The first conductive via 140 may be metal over diffusion (MD). The first conductive vias 140 may be separated or cut by at least one cut portion 140C, wherein the cut portion 140C may be called "cut MD (CMD)". The first conductive via 140 may be formed of a material including, W, Co, Ru, Mo, Cu, etc. The first conductive via 140 includes at least one first portion (or first narrow portion) 141 which has the aforementioned first width WX1, and the oxide layer 180 is formed below the first portion 141 of the first conductive via 140.

As illustrated in FIGS. 1A to 1C, the first conductive via 140 has a base width WX$_B$ in the second direction X, and a second ratio R12 of the first width WX1 to the base width WX$_B$ (that is, R12=WX1/WX$_B$) ranges between 0.5 and 0.99. In the present embodiment, the first conductive via 140 further includes at least one base portion 142 which has the base width WX$_B$, and the epitaxy layer 170 is formed below the base portion 142 of the first conductive via 140.

As illustrated in FIGS. 1B to 1C, the second conductive via 150 has a via width WX3 in the second direction X, and the first width WX1 of the first portion 141 is less than the via width WX3. In addition, the base width WX$_B$ is greater than the first width WX1 and the via width WX3. As a result, the second conductive via 150 may be fully in contact with the base portion 142 of the first conductive via 140 for increasing the electrical transmission quality between the first conductive via 140 and the second conductive via 150.

As illustrated in FIGS. 1A, the base portion 142 has a first lateral surface 142s, and the first portion 141 has a second lateral surface 141s recessed with respect to the first lateral surface 142s.

In an embodiment, if the single first conductive via (for example, the first conductive via 140' in FIGS. 1A and 1B) is connected to the second conductive via 150 (for example, the second conductive via 150 is formed over the first conductive via 140' in FIG. 1A), a portion of the first conductive via 140' may be narrowed except for other portion corresponding to the second conductive via 150 and the epitaxy layer 170, and the structure of the first conductive via 140 may be designed to satisfy the first ratio R11 and the second ratio R12.

In another embodiment, if the single first conductive via (for example, the first conductive via 140" in FIGS. 1A and 1D) is not connected to the second conductive via 150 (for example, there is no second conductive via 150 formed over the first conductive via 140 FIG. 1A), the whole of the first conductive via 140" may be narrowed (that is, without the base portion 142) even if the epitaxy layer 170 is formed under the first conductive via 140", and the structure of the first conductive via 140" may be designed to satisfy the first ratio R11.

In addition, at least one of the first conductive vias 140 in the semiconductor device 100 may be narrowed.

As illustrated in FIGS. 1A to 1C, the second conductive via 150 is formed over and electrically connected to the first conductive via 140. The second conductive via 150 may be formed of a material including, copper, tungsten, TiN, etc. The second conductive via 150 and the first portion 141 of the first conductive via 140 are staggered in the first direction Y, and thus it may prevent the first conductive via 140 from be contact in the second conductive via 150 by a small area or an insufficient area of the first portion 141.

As illustrated in FIGS. 1A to 1C, the third conductive via 160 is formed over and electrically connected to the metal gate 130. The third conductive via 160 may be formed of a material including, copper, tungsten, TiN, etc.

As illustrated in FIGS. 1B, each epitaxy layer 170 is formed between adjacent two of the metal gates 130. The epitaxy layer 170 may be a drain or a source of a transistor including the metal gates 130. The semiconductor device 100 may include a plurality of the transistors each including one metal gate 130, one epitaxy layer 170 serving as the drain, and another epitaxy layer 170 serving as the source.

As illustrated in FIG. 1B to 1C, the spacer 175 is formed over the metal 131 and the inner spacer 132. The spacer 176 is formed on a sidewall of the first conductive via 140, and isolates the first conductive via 140 from the metal gate 130. The spacer 176 may formed before the first conductive via 140 is formed or after the first conductive via 140 is formed. The spacer 176 may be formed of a material including, a dielectric material.

As illustrated in FIG. 1C, the oxide layer 180 is formed between adjacent two of the metal gates 130. The oxide layer 180 is, for example, a STI (Shallow Trench Isolation).

Figure 2:
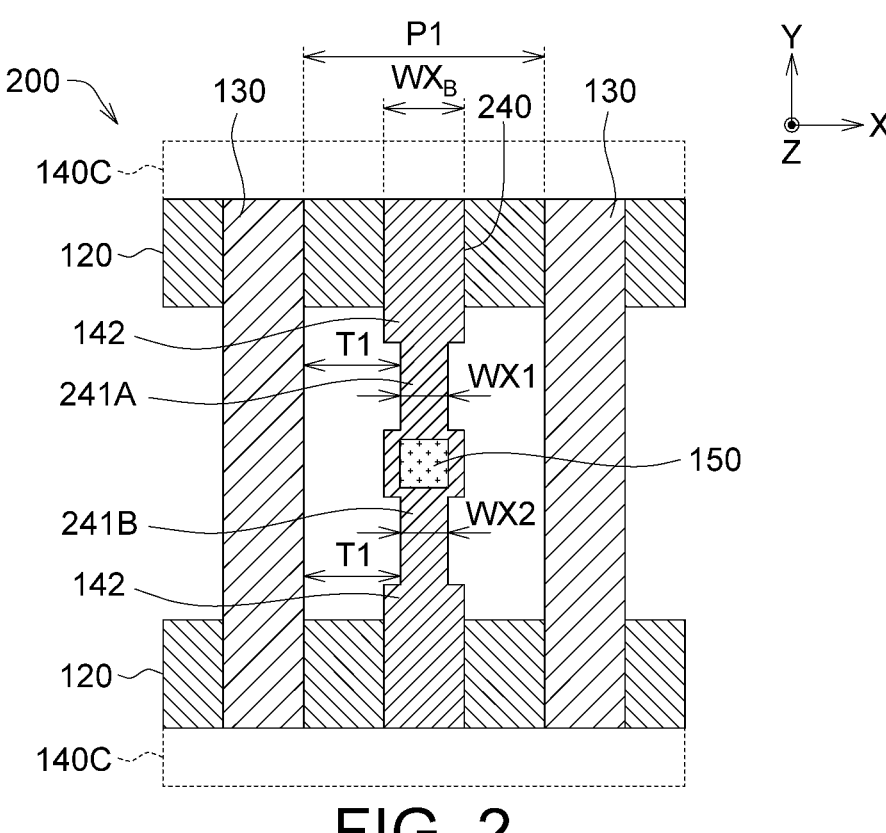
FIG. 2 illustrates a schematic diagram of a top view of a partial portion of a semiconductor device.

Referring to FIG. 2, FIG. 2 illustrates a schematic diagram of a top view of a partial portion of a semiconductor device 200. The semiconductor device 200 may be, for example, a forksheet structure, a nanosheet structure, etc.

As illustrated in FIG. 2, the semiconductor device 200 includes the substrate 110 (not illustrated), a plurality of the OD structures 120, a plurality of the metal gates 130 (not illustrated), at least one first conductive via 240, at least one second conductive via 150, at least one third conductive via 160 (not illustrated), at least one epitaxy layer 170 (not illustrated), at least one spacer 175 (not illustrated), at least one spacer 176 (not illustrated) and at least on oxide layer 180 (not illustrated).

The semiconductor device 200 includes the features the same as or similar to that of the semiconductor device 100, and difference is that at least one first conductive via 240 and the first conductive via 140 are different in structure.

As illustrated in FIG. 2, the first conductive via 240 includes a first portion 241A having the first width WX1, a second portion (or second narrow portion) 241B having a second width WX2 and the base portion 142 having the base width WX$_B$. The first portion 241A and the second portion 241B are located at two opposite sides of the second conductive via 150 respectively in the first direction Y. The first portion 241A is separated from the second portion 241B.

The first ratio R11 of the first width WX1 of the first portion 241A to the pitch P1 (that is, R11=WX1/P1) may be a real number ranging between 0.2 and 0.7 (for example, 0.2, 0.3, 0.4, 0.5, 0.6, 0.7, etc.), and/or the second ratio R12 of the first width WX1 of the first portion 241A to the base width WX$_B$ (that is, R12=WX1/WX$_B$) may be a real number ranging between 0.5 and 0.99 (for example, 0.5, 0.6, 0.7, 0.8, 0.9, 0.99 etc.). In addition, a first ratio R21 of the second width WX2 of the second portion 241B to the pitch P1 (that is, R21=WX2/P1) may be a real number ranging between 0.2 and 0.7 (for example, 0.2, 0.3, 0.4, 0.5, 0.6, 0.7, etc.), and/or a second ratio R22 of the second width WX2 of the second portion 241B to the base width WX$_B$ (that is, R22=WX2/WX$_B$) may be a real number ranging between 0.5 and 0.99 (for example, 0.5, 0.6, 0.7, 0.8, 0.9, 0.99, etc.). As a result, the first width WX1 and/or the second width WX2 widen the interval T1 between the adjacent metal gates 130 and first conductive via 240, and accordingly it may reduce the parasitic capacitance of the dielectric material between the metal gate 130 and the first conductive via 240. In an embodiment, the first width WX1 may be less than, greater than or equal to the second width WX2.

Figure 3:
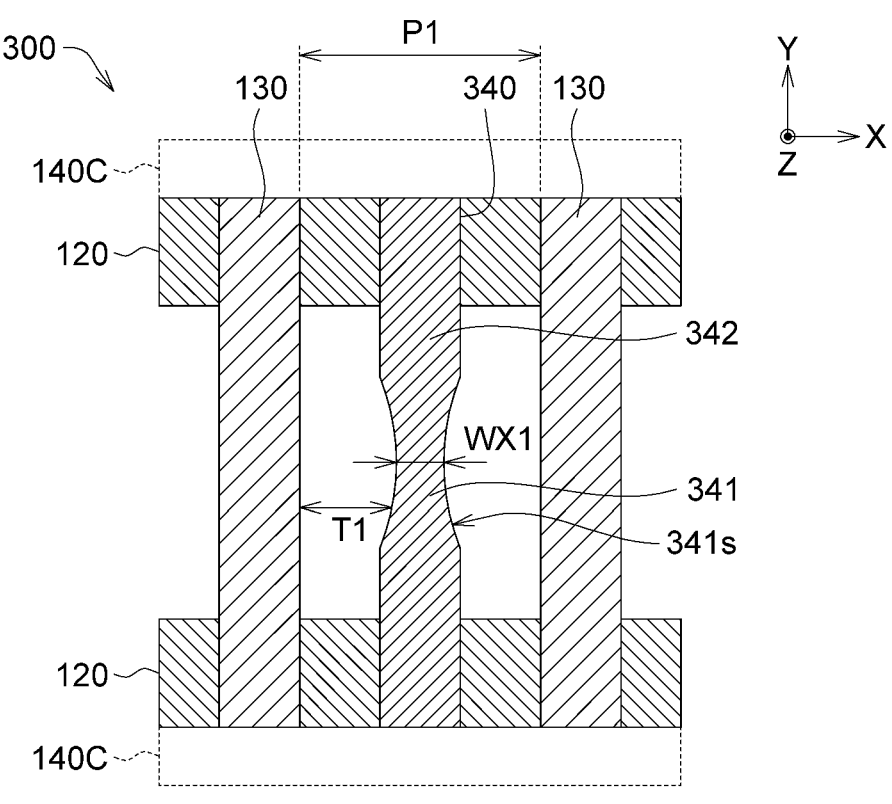
FIG. 3 illustrates a schematic diagram of a top view of a partial portion of a semiconductor device.

Referring to FIG. 3, FIG. 3 illustrates a schematic diagram of a top view of a partial portion of a semiconductor device 300. The semiconductor device 300 may be, for example, a forksheet structure, a nanosheet structure, etc.

As illustrated in FIG. 3, the semiconductor device 300 includes the substrate 110 (not illustrated), a plurality of the OD structures 120, a plurality of the metal gates 130, at least one first conductive via 340, at least one second conductive via 150 (not illustrated), at least one third conductive via 160 (not illustrated), at least one epitaxy layer 170 (not illustrated), at least one spacer 175 (not illustrated), at least one spacer 176 (not illustrated) and at least on oxide layer 180 (not illustrated).

The semiconductor device 300 includes the features the same as or similar to that of the semiconductor device 100, and difference is that at least one first conductive via 340 and the first conductive via 140 are different in structure.

The first conductive via 340 includes a first portion 341 having the first width WX1 and a base portion 342 having the base width $WX_B$. The first portion 341 has at least one second lateral surface 341$s$, and the second lateral surface 341$s$ is a curved surface. The first ratio R11 of the first width WX1 of the first portion 341 to the pitch P1 (that is, R11=WX1/P1) may range between 0.2 and 0.7, and/or the second ratio R12 of the first width WX1 of the first portion 341 to the base width $WX_B$ (that is, R12=WX1/$WX_B$) may range between 0.5 and 0.99. As a result, the first width WX1 widens the interval T1 between the adjacent metal gate 130 and first conductive via 340, and accordingly it may reduce the parasitic capacitance of the dielectric material between the metal gate 130 and the first conductive via 340.

As illustrated in FIG. 3, the second lateral surface 341$s$ may not extend to the cut portions 140C. In the present embodiment, there is no the second conductive via 150 formed over the first conductive via 340, and thus the second lateral surface 341$s$ may extend to the cut portions 140C, that is, the first portion 341 may extend to be over the epitaxy layer 170 (corresponding the region of the OD structure 120).

In addition, at least one portion of the second lateral surface 341$s$ may be curved shape. In other words, a portion of the second lateral surface 341$s$ may be curved shape, and another portion of the second lateral surface 341$s$ may be a flat surface. At least one of the opposite two second lateral surfaces 341$s$ of the first conductive via 340 may be curved shape.

Figure 4:
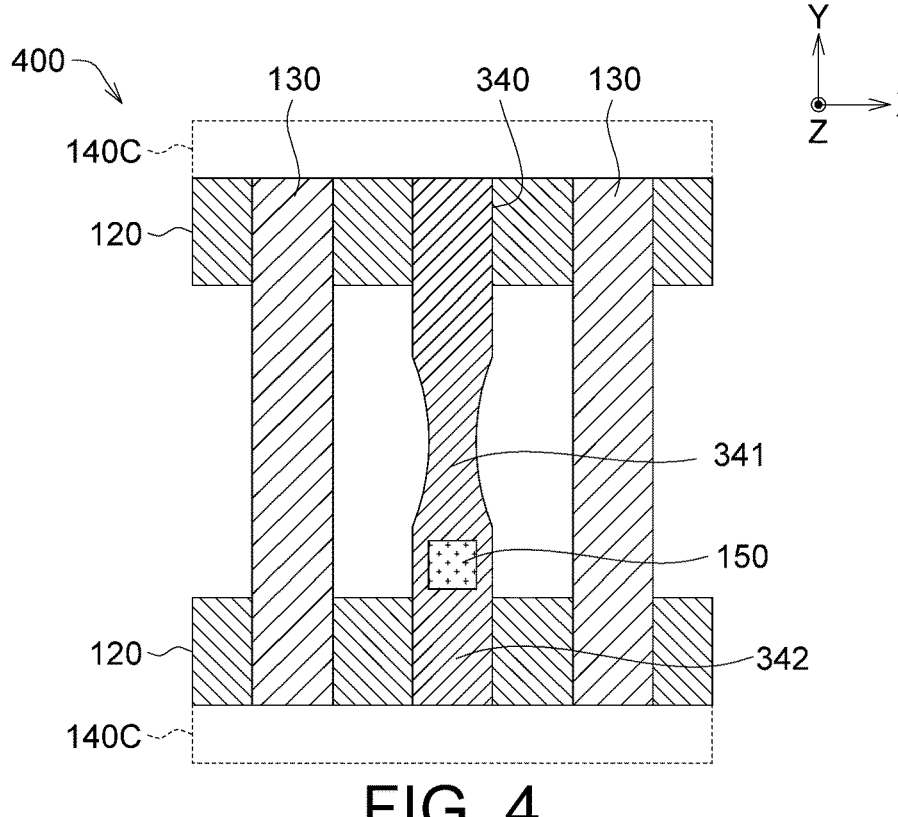
FIG. 4 illustrates a schematic diagram of a top view of a partial portion of a semiconductor device.

Referring to FIG. 4, FIG. 4 illustrates a schematic diagram of a top view of a partial portion of a semiconductor device 400. The semiconductor device 400 may be, for example, a forksheet structure, a nanosheet structure, etc.

As illustrated in FIG. 4, the semiconductor device 400 includes the substrate 110 (not illustrated), a plurality of the OD structures 120, a plurality of the metal gates 130, at least one first conductive via 340, at least one second conductive via 150, at least one third conductive via 160 (not illustrated), at least one epitaxy layer 170 (not illustrated), at least one spacer 175 (not illustrated), at least one spacer 176 (not illustrated) and at least on oxide layer 180 (not illustrated).

The semiconductor device 400 includes the features the same as or similar to that of the semiconductor device 300, and difference is that the second conductive via 150 is formed over and electrically connected to the first conductive via 340.

In the present embodiment, the second conductive via 150 is formed over the first conductive via 340, and thus the second lateral surface 341$s$ may not extend to the cut portions 140C, that is, the first portion 341 may not extend to be over the epitaxy layer 170 (corresponding the region of the OD structure 120). As a result, the first conductive via 340 may provide enough area (of the base portion 342) for being contact with the second conductive via 150, and thus the electrical connection quality between the first conductive via 340 and the second conductive via 150 may be maintained or promoted.

Figure 5:
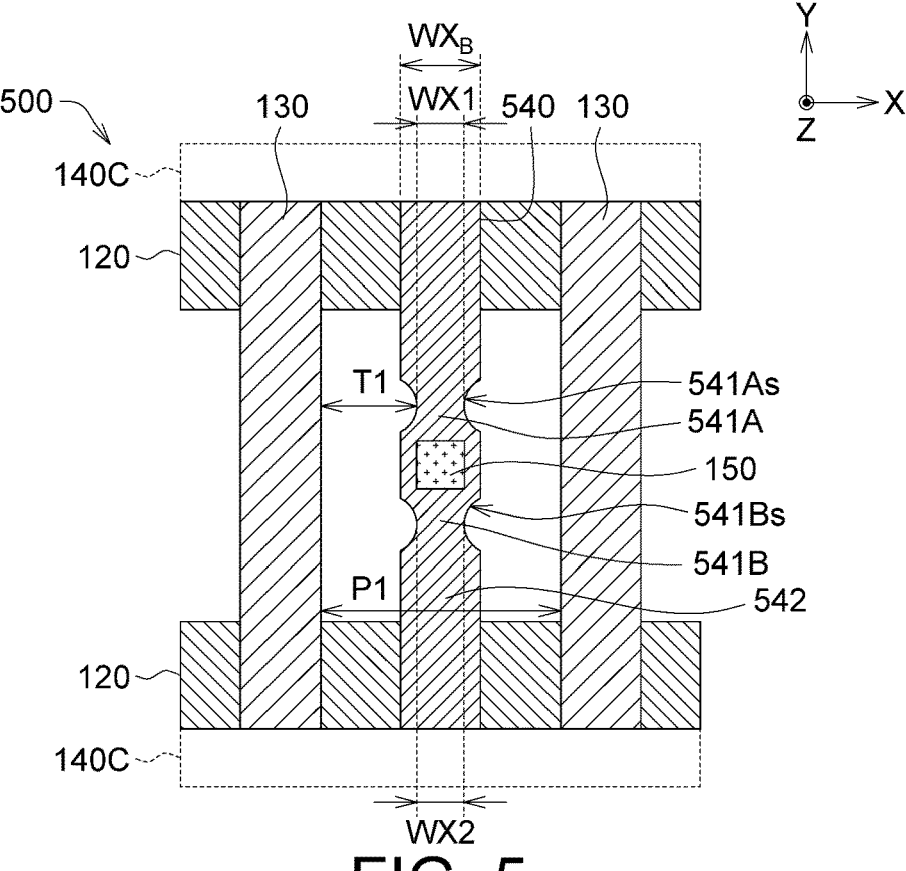
FIG. 5 illustrates a schematic diagram of a top view of a partial portion of a semiconductor device.

Referring to FIG. 5, FIG. 5 illustrates a schematic diagram of a top view of a partial portion of a semiconductor device 500. The semiconductor device 500 may be, for example, a forksheet structure, a nanosheet structure, etc.

As illustrated in FIG. 5, the semiconductor device 500 includes the substrate 110 (not illustrated), a plurality of the OD structures 120, a plurality of the metal gates 130, at least one first conductive via 540, at least one second conductive via 150, at least one third conductive via 160 (not illustrated), at least one epitaxy layer 170 (not illustrated), at least one spacer 175 (not illustrated), at least one spacer 176 (not illustrated) and at least on oxide layer 180 (not illustrated).

The semiconductor device 500 includes the features the same as or similar to that of the semiconductor device 200, and difference is that at least one first conductive via 540 and the first conductive via 240 are different in structure.

As illustrated in FIG. 5, the first conductive via 540 includes a first portion 541A having the first width WX1, a second portion 541B having a second width WX2 and the base portion 142 having the base width $WX_B$. The first portion 541A and the second portion 541B are located at two opposite sides of the second conductive via 150 respectively in the first direction Y. In the present embodiment, the first portion 541A has a second lateral surface 541As, the second portion 541B has a second lateral surface 541Bs, and the second lateral surface 541As and the second lateral surface 541Bs are curved surfaces. In another embodiment, at least one portion of the second lateral surface of the first conductive via 540 may be a flat surface, a curved surface or a combination thereof.

Figure 6A:
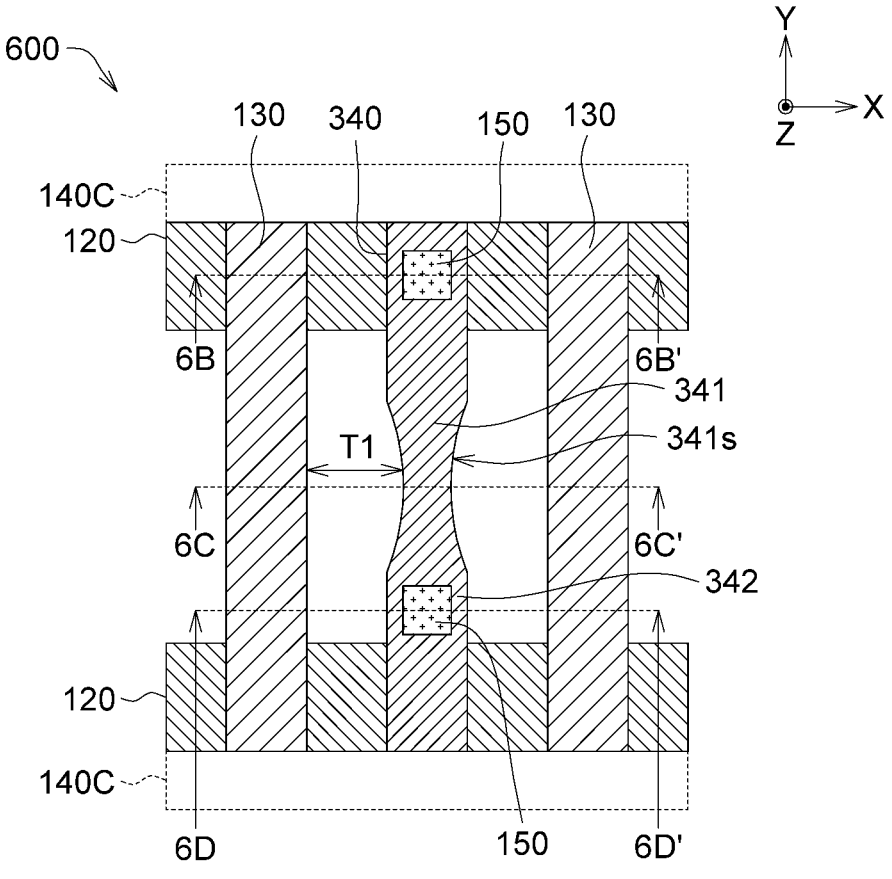
FIG. 6A illustrates a schematic diagram of a top view of a partial portion of a semiconductor device.
Figures 6B, 6C, 6D:
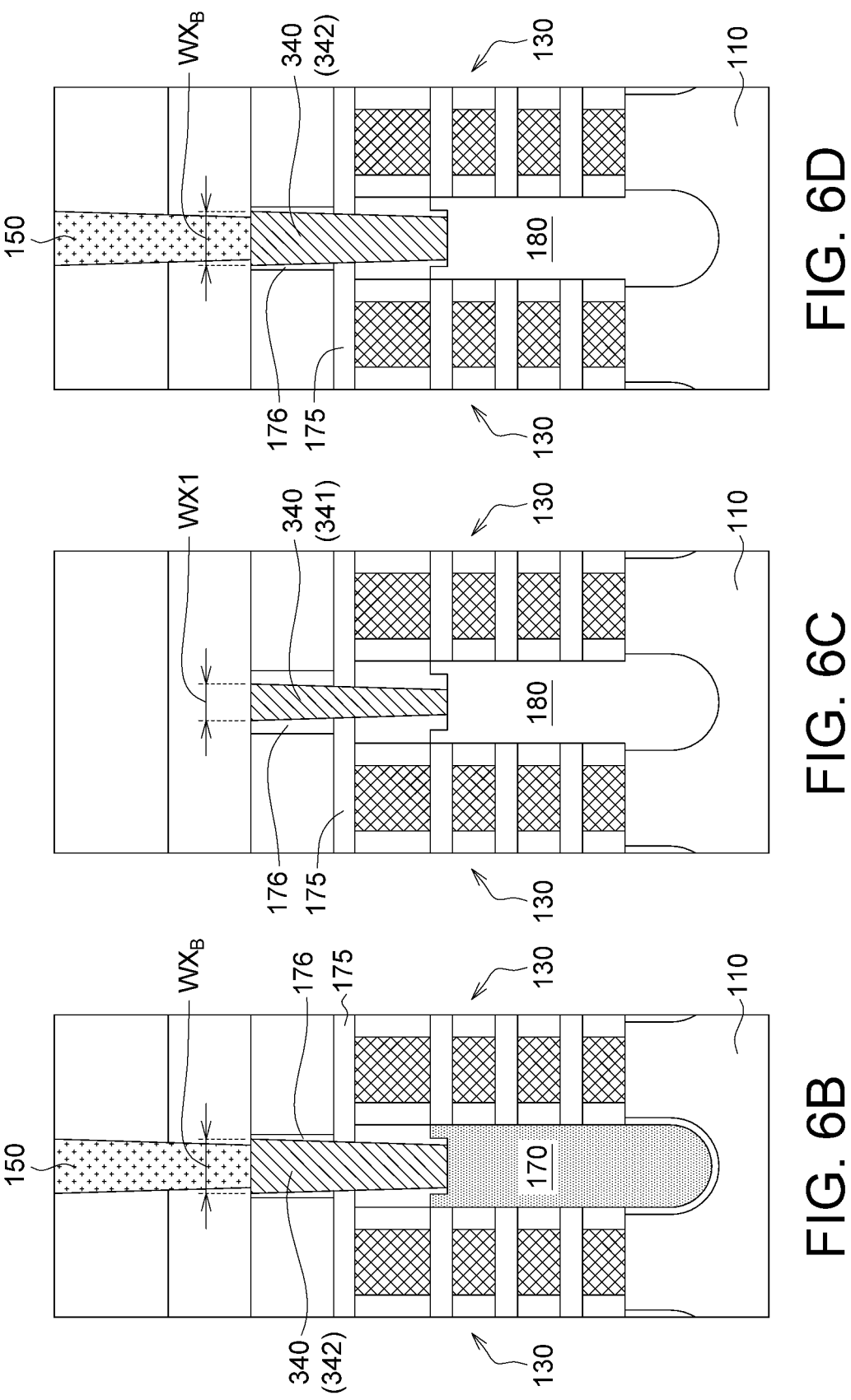
FIG. 6B illustrates a schematic diagram of a cross-sectional view of the semiconductor device in a direction 6B-6B'.
FIG. 6C illustrates a schematic diagram of a cross-sectional view of the semiconductor device in a direction 6C-6C'.
FIG. 6D illustrates a schematic diagram of a cross-sectional view of the semiconductor device in a direction 6D-6D'.

Referring to FIGS. 6A to 6D, FIG. 6A illustrates a schematic diagram of a top view of a partial portion of a semiconductor device 600, FIG. 6B illustrates a schematic diagram of a cross-sectional view of the semiconductor device 600 in a direction 6B-6B', FIG. 6C illustrates a schematic diagram of a cross-sectional view of the semiconductor device 600 in a direction 6C-6C', and FIG. 6D illustrates a schematic diagram of a cross-sectional view of the semiconductor device 600 in a direction 6D-6D'. The semiconductor device 600 may be, for example, a forksheet structure, a nanosheet structure, etc.

As illustrated in FIGS. 6A to 6D, the semiconductor device 600 includes the substrate 110, a plurality of the OD structures 120, a plurality of the metal gates 130, at least one first conductive via 340, at least one second conductive via 150, at least one third conductive via 160 (not illustrated), at least one epitaxy layer 170, at least one spacer 175, at least one spacer 176 and at least on oxide layer 180.

The semiconductor device 600 includes the features the same as or similar to that of the semiconductor device 400, and difference is that a plurality of the second conductive vias 150 are formed over and electrically connected to the first conductive via 340.

As illustrated in FIGS. 6A to 6D, in the embodiment, the first conductive via 340 includes the first portion 341 having the first width WX1 and the base portion 342 having the base width $WX_B$. The first portion 341 has at least one second lateral surface 341$s$, and the second lateral surface 341$s$ is a curved surface. The first ratio R11 of the first width WX1 of the first portion 341 to the pitch P1 (that is, R11=WX1/P1) may range between 0.2 and 0.7 and/or the second ratio R12 of the first width WX1 of the first portion 341 to the base width $WX_B$ (that is, $R12=WX1/WX_B$) may range between 0.5 and 0.99. As a result, the first width WX1 widen the interval T1 between the adjacent metal gates 130 and first conductive via 340, and accordingly it may reduce the parasitic capacitance of the dielectric material between the metal gate 130 and the first conductive via 340.

In the present embodiment, the second conductive via 150 is formed over the first conductive via 340, and thus the second lateral surface 341s may not extend to the cut portions 140C, that is, the first portion 341 may not extend to be over the epitaxy layer 170 (corresponding the region of the OD structure 120). As a result, the first conductive via 340 may provide enough area (of the base portion 342) for being contact with the second conductive via 150, and thus the electrical connection quality between the first conductive via 340 and the second conductive via 150 may be maintained or promoted.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

According to the present disclosure, a semiconductor device includes a plurality of OD structures, a plurality of metal gates and a first conductive via. The OD structures are arranged in a first direction. The metal gates extend in a second direction. The first conductive via is located between two of the metal gates, extending in the first direction and having a first width in the second direction. There is a pitch between adjacent two of the metal gates in the second direction, and a first ratio of the first width to the pitch ranges between 0.2 and 0.7. Accordingly, the first width may widen the interval between the adjacent metal gate and first conductive via, and accordingly it may reduce the parasitic capacitance of the dielectric material between the metal gate and the first conductive via.

Example embodiment 1: a semiconductor device includes a substrate, a plurality of OD structures, a plurality of metal gates and a first conductive via. The OD structures are formed on the substrate and arranged in a first direction. The metal gates are formed on the substrate and extend in the first direction. The first conductive via is formed on substrate, located between two of the metal gates, extends in the first direction and has a first width in a second direction. There is a pitch between adjacent two of the metal gates in the second direction, and a first ratio of the first width to the pitch ranges between 0.2 and 0.7.

Example embodiment 2 based on Example embodiment 1: the first conductive via includes a first portion having the first width, and the semiconductor device further includes an oxide layer. The oxide layer is formed below the first portion of the first conductive via.

Example embodiment 3 based on Example embodiment 1: the first conductive via includes a first portion having the first width, and the semiconductor device further includes an epitaxy layer. The epitaxy layer is formed below the first portion of the first conductive via.

Example embodiment 4 based on Example embodiment 1: the semiconductor device further includes a second conductive via. The second conductive via is formed above the first conductive via. The first conductive via has a base width in the second direction, and a second ratio of the first width to the base width ranges between 0.5 and 0.99.

Example embodiment 5 based on Example embodiment 4: the first conductive via includes a base portion having the base width, and the semiconductor device further includes an epitaxy layer. The epitaxy layer is formed below the base portion of the first conductive via.

Example embodiment 6 based on Example embodiment 4: the first conductive via includes a first portion having the first width, and the second conductive via and the first portion are staggered in the second direction.

Example embodiment 7 based on Example embodiment 1: the first conductive via includes a first portion having the first width and a second portion. The semiconductor device further includes a second conductive via. The second conductive via is formed above the first conductive via. The first portion and the second portion are located at two opposite sides of the second conductive via respectively in the first direction.

Example embodiment 8 based on Example embodiment 1: the first conductive via includes a first portion having the first width and a second portion having a second width, the first portion is separated from the second portion, and the first width is different from the second width.

Example embodiment 9: a semiconductor device includes a plurality of OD structures, a plurality of metal gates and a first conductive via. The OD structures are formed on the substrate and arranged in a first direction. The metal gates are formed on the substrate and extending in the first direction. The first conductive via is formed on the substrate, located between two of the metal gates, extends in the first direction and includes a first portion and a base portion. The base portion has a first lateral surface, and the first portion has a second lateral surface recessed with respect to the first lateral surface.

Example embodiment 10 based on Example embodiment 9: the first portion has a first width in the second direction, there is a pitch between adjacent two of the metal gates in the second direction, and a first ratio of the first width to the pitch ranges between 0.2 and 0.7.

Example embodiment 11 based on Example embodiment 9: the semiconductor device further incudes an oxide layer. The oxide layer is formed below the first portion of the first conductive via.

Example embodiment 12: the semiconductor device further includes an epitaxy layer. The epitaxy layer is formed below the first portion of the first conductive via.

Example embodiment 13 based on Example embodiment 9: the semiconductor device further includes a second conductive via. The second conductive via is formed above the first conductive via. The first conductive via has a first width in the second direction, the first conductive via has a base width in the second direction, and a second ratio of the first width to the base width ranges between 0.5 and 0.99.

Example embodiment 14 based on Example embodiment 13: the first conductive via includes a base portion having the base width, and the semiconductor device further includes an epitaxy layer. The epitaxy layer is formed below the base portion of the first conductive via.

Example embodiment 15 based on Example embodiment 13: the second conductive via and the first portion are staggered in the first direction.

Example embodiment 16 based on Example embodiment 9: the first conductive via further includes a second portion; the semiconductor device further includes a second conductive via. The second conductive via is formed above the first conductive via. The first portion and the second portion are located at two opposite sides of the second conductive via respectively in the first direction.

Example embodiment 17 based on Example embodiment 9: the second lateral surface is a curved surface, a flat surface and a combination thereof.

Example embodiment 18: a semiconductor device includes a substrate, a plurality of OD structures, a plurality of metal gates, a first conductive via, a second conductive via and an epitaxy layer. The OD structures are formed on the substrate and arranged in a first direction. The metal gates are formed on the substrate and extending in the first direction. The first conductive via is formed on the substrate, located between two of the metal gates, extends in the first direction and includes a first portion. The second conductive via is formed above and connected with the first conductive via. The epitaxy layer is formed below the first conductive via. The first portion is staggered with the epitaxy layer and the second conductive via in the first direction.

Example embodiment 19 based on Example embodiment 18: the first portion has a first width in the second direction, the second conductive via has a via width, the first width is less than the via width.

Example embodiment 20 based on Example embodiment 19: the first conductive via has a base width greater than the first width and the via width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a plurality of oxide definition (OD) structures formed on the substrate and arranged in a first direction;
a plurality of metal gates formed on the substrate and extending in the first direction; and
a first conductive via formed on the substrate, located between two of the metal gates, extending in the first direction and having a first width in a second direction;
wherein there is a pitch between adjacent two of the metal gates in the second direction, and a first ratio of the first width to the pitch ranges between 0.2 and 0.7;
wherein the semiconductor device further comprises:
a second conductive via formed above the first conductive via;
wherein the first conductive via has a base width in the second direction, and a second ratio of the first width to the base width ranges between 0.5 and 0.99.

2. The semiconductor device as claimed in claim 1, wherein the first conductive via comprises a first portion having the first width, and the semiconductor device further comprises:
an oxide layer formed below the first portion of the first conductive via.

3. The semiconductor device as claimed in claim 1, wherein the first conductive via comprises a first portion having the first width, and the semiconductor device further comprises:
an epitaxy layer formed below the first portion of the first conductive via.

4. The semiconductor device as claimed in claim 1, wherein the first conductive via comprises a base portion having the base width, and the semiconductor device further comprises:
an epitaxy layer formed below the base portion of the first conductive via.

5. The semiconductor device as claimed in claim 1, wherein the first conductive via comprises a first portion having the first width, and the second conductive via and the first portion are staggered in the first direction.

6. The semiconductor device as claimed in claim 1, wherein the first conductive via comprises a first portion having the first width and a second portion;
wherein the first portion and the second portion are located at two opposite sides of the second conductive via respectively in the first direction.

7. The semiconductor device as claimed in claim 1, wherein the first conductive via comprises a first portion having the first width and a second portion having a second width, the first portion is separated from the second portion, and the first width is different from the second width.

8. A semiconductor device, comprising:
a substrate;
a plurality of OD structures formed on the substrate and arranged in a first direction;
a plurality of metal gates formed on the substrate and extending in the first direction; and
a first conductive via formed on the substrate, located between two of the metal gates, extending in the first direction and comprising a first portion and a base portion;
wherein the base portion has a first lateral surface, and the first portion has a second lateral surface recessed with respect to the first lateral surface;
wherein the semiconductor device further comprises:
a second conductive via formed above the first conductive via;
wherein the first conductive via has a first width in the second direction, the first conductive via has a base width in a second direction, and a second ratio of the first width to the base width ranges between 0.5 and 0.99.

9. The semiconductor device as claimed in claim 8, wherein the first portion has a first width in the second direction, there is a pitch between adjacent two of the metal gates in the second direction, and a first ratio of the first width to the pitch ranges between 0.2 and 0.7.

10. The semiconductor device as claimed in claim 8, further comprising:
an oxide layer formed below the first portion of the first conductive via.

11. The semiconductor device as claimed in claim 8, wherein the semiconductor device further comprises:
an epitaxy layer formed below the first portion of the first conductive via.

12. The semiconductor device as claimed in claim 8, wherein the first conductive via comprises a base portion having the base width, and the semiconductor device further comprises:

an epitaxy layer formed below the base portion of the first conductive via.

13. The semiconductor device as claimed in claim 8, wherein the second conductive via and the first portion are staggered in the first direction.

14. The semiconductor device as claimed in claim 8, wherein the first conductive via further comprises a second portion, and the first portion and the second portion are located at two opposite sides of the second conductive via respectively in the first direction.

15. The semiconductor device as claimed in claim 8, wherein the second lateral surface is a curved surface, a flat surface and a combination thereof.

16. A semiconductor device, comprising:

a substrate;

a plurality of OD structures formed on the substrate and arranged in a first direction;

a plurality of metal gates formed on the substrate and extending in the first direction;

a first conductive via formed on the substrate, located between two of the metal gates, extending in the first direction and comprising a first portion;

a second conductive via formed above and connected with the first conductive via; and an epitaxy layer formed below the first conductive via;

wherein the first portion is staggered with the epitaxy layer and the second conductive via in the first direction;

wherein the first conductive via has a base width in a second direction, and a second ratio of the first width to the base width ranges between 0.5 and 0.99.

17. The semiconductor device as claimed in claim 16, wherein the first portion has a first width in the second direction, the second conductive via has a via width, the first width is less than the via width.

18. The semiconductor device as claimed in claim 17, wherein the base width is greater than the first width and the via width.

19. The semiconductor device as claimed in claim 16, wherein the first conductive via comprises a base portion having the base width, and the epitaxy layer is formed below the base portion of the first conductive via.

20. The semiconductor device as claimed in claim 16, wherein the first conductive via further comprises a second portion, and the first portion and the second portion are located at two opposite sides of the second conductive via respectively in the first direction.

\* \* \* \* \*